United States Patent
Hsieh et al.

(10) Patent No.: US 10,141,527 B2
(45) Date of Patent: Nov. 27, 2018

(54) FOLDABLE SUBSTRATE, METHOD FOR FORMING THE SAME AND FLEXIBLE DISPLAY DEVICE

(71) Applicant: BOE TECHNOLOGY GROUP CO., LTD., Beijing (CN)

(72) Inventors: Mingche Hsieh, Beijing (CN); Chunyan Xie, Beijing (CN); Lu Liu, Beijing (CN); Hejin Wang, Beijing (CN)

(73) Assignee: BOE TECHNOLOGY GROUP CO., LTD. (CN)

( * ) Notice: Subject to any disclaimer, the term of this patent is extended or adjusted under 35 U.S.C. 154(b) by 0 days.

(21) Appl. No.: 15/511,085

(22) PCT Filed: Mar. 23, 2016

(86) PCT No.: PCT/CN2016/077092
§ 371 (c)(1),
(2) Date: Mar. 14, 2017

(87) PCT Pub. No.: WO2016/161894
PCT Pub. Date: Oct. 13, 2016

(65) Prior Publication Data
US 2018/0026211 A1    Jan. 25, 2018

(30) Foreign Application Priority Data
Apr. 10, 2015  (CN) .......................... 2015 1 0167391

(51) Int. Cl.
*H01L 51/00* (2006.01)
*H01L 21/683* (2006.01)
(Continued)

(52) U.S. Cl.
CPC ........ *H01L 51/0097* (2013.01); *B32B 17/064* (2013.01); *H01L 21/683* (2013.01);
(Continued)

(58) Field of Classification Search
CPC .................................................. H01L 51/0097
(Continued)

(56) References Cited

U.S. PATENT DOCUMENTS 5,717,556 A * 2/1998 Yanagida ............. H05K 1/0278
174/254
2009/0021666 A1   1/2009 Chen

FOREIGN PATENT DOCUMENTS

| CN | 103926774 A | 7/2014 |
| CN | 104346999 A | 2/2015 |

(Continued)

OTHER PUBLICATIONS

First Office Action for Chinese Application No. 201510167391.0, dated May 22, 2017, 6 Pages.
(Continued)

*Primary Examiner* — Hoa C Nguyen
*Assistant Examiner* — Stanley Tso
(74) *Attorney, Agent, or Firm* — Brooks Kushman P.C.

(57) ABSTRACT

A foldable substrate, a method for forming the same, and a flexible display device are provided. The foldable substrate includes a plurality of rigid supporting portions separated from each other, every two of which are not in contact with each other, and a flexible foldable portion connecting two adjacent rigid supporting portions of the plurality of rigid supporting portions.

12 Claims, 4 Drawing Sheets

(51) Int. Cl.
  *H01L 27/12*   (2006.01)
  *B32B 17/06*   (2006.01)
  *H01L 51/52*   (2006.01)
  *H01L 51/56*   (2006.01)
  *H01L 27/32*   (2006.01)

(52) U.S. Cl.
  CPC ............ *H01L 27/12* (2013.01); *H01L 51/524* (2013.01); *H01L 51/56* (2013.01); *B32B 2457/20* (2013.01); *H01L 27/3244* (2013.01); *H01L 51/003* (2013.01); *H01L 2251/5338* (2013.01)

(58) Field of Classification Search
  USPC ......................................................... 174/250
  See application file for complete search history.

(56) References Cited

FOREIGN PATENT DOCUMENTS

| | | |
|---|---|---|
| CN | 204143398 U | 2/2015 |
| CN | 104851889 A | 8/2015 |
| JP | 2009110780 A | 5/2009 |
| TW | 200905243 A | 2/2009 |

OTHER PUBLICATIONS

PCT International Search Report and Written Opinion dated Jun. 30, 2016, Application No. PCT/CN20161077092, 12 Pages.
Second Office Action for Chinese Application No. 201510167391.0, dated Oct. 20, 2017, 5 Pages.

* cited by examiner

FOLDABLE SUBSTRATE, METHOD FOR FORMING THE SAME AND FLEXIBLE DISPLAY DEVICE

CROSS-REFERENCE TO RELATED APPLICATION APPLICATIONS

This application is the U.S. national phase of PCT Application No. PCT/CN2016/077092 filed on Mar. 23, 2016. which claims priority to Chinese Patent Application No. 201510167391.0 filed on Apr. 10, 2015, the disclosures of which are incorporated in their entirety by reference herein.

TECHNICAL FIELD

The present disclosure relates to the field of display technology, and in particular to a foldable substrate, a method for forming the same and a flexible display device.

BACKGROUND

Currently, a base substrate of a flexible display device which is bendable is usually a thin glass substrate or a plastic substrate. The thin glass substrate can be bent to a certain degree, but it is not foldable. The plastic substrate is bendable and foldable, but plastics are of a poor stability and mechanical strength. In addition, as shown in FIG. 1, because of a poor rigidity of the plastic substrate, the plastic substrate will be bent during the manufacturing of the flexible display device, and the yield of product may be reduced as a result. As a solution in the related art, a glass substrate is used as a carrier of the plastic substrate during the manufacturing process, and the glass substrate is separated from the plastic substrate after the manufacturing process is completed, therefore the manufacturing process may be more complex and the cost of production may be increased.

SUMMARY

An object of the present disclosure is to provide a foldable substrate, a method for forming the same and a flexible display device. The foldable substrate is both rigid and foldable, and a flexible display device supported by the foldable substrate is foldable.

In order to solve the above technical issues, the present disclosure provides the following technical solutions.

On the one hand, a foldable substrate is provided in the present disclosure, including:
  a plurality of rigid supporting portions separated from each other, every two of which are not in contact with each other; and
  a flexible foldable portion connecting two adjacent rigid supporting portions of the plurality of rigid supporting portions.

Furthermore, the flexible foldable portion is made of an organic material.

Furthermore, the organic material includes, but not limited to, polyethylene naphthalene, polyethylene terephthalate, polyimide and cyclic polyolefin.

Furthermore, the rigid supporting portions each includes:
  an organic base substrate provided with a groove;
  a hard substrate arranged in and adapted to the groove, wherein the hard substrate fits tightly to the groove.

Furthermore, the hard substrate is a glass substrate.

Furthermore, the organic base substrate is formed integrally with the flexible foldable portion.

Furthermore, the plurality of rigid supporting portions separated from each other, every two of which are not in contact with each other, each includes two rigid supporting portions, and the foldable substrate further includes a flexible foldable portion connecting the two rigid supporting portions.

Optionally, the plurality of rigid supporting portions separated from each other, every two of which are not in contact with each other, is of an identical size and an identical shape.

Optionally, the organic base substrate is made of a material identical to the flexible foldable portion.

Optionally, two rigid supporting portions are of a cuboid shape.

A flexible display device is further provided in the present disclosure, including the foldable substrate hereinabove and a display component arranged on the foldable substrate.

A method for forming a foldable substrate is further provided in the present disclosure, including:
  arranging a plurality of hard substrates separated from each other, every two of which are not in contact with each other, on a carrier substrate;
  coating a flexible material onto the carrier substrate arranged with the plurality of hard substrates, to fill gaps between two adjacent hard substrates of the plurality of hard substrates and cover all the hard substrates; and
  separating the plurality of hard substrates and the flexible material from the carrier substrate, to form a foldable substrate, wherein rigid supporting portions of the foldable substrate includes the plurality of hard substrates and the flexible material covering the plurality of hard substrates, and a flexible foldable portion of the foldable substrate includes the flexible material between the plurality of hard substrates.

Furthermore, each of the plurality of hard substrates is a glass substrate, and the flexible material is an organic material.

Optionally, the separating the plurality of hard substrates and the flexible material from the carrier substrate includes:
  irradiating a boundary between the plurality of hard substrates and the flexible material and the carrier substrate with a laser beam, to separate the plurality of hard substrates and the flexible material from the carrier substrate.

Optionally, the organic material includes polyethylene naphthalene, polyethylene terephthalate, polyimide and cyclic polyolefin.

According to the present disclosure, the foldable substrate includes a plurality of rigid supporting portion and a flexible foldable portion connecting two adjacent rigid supporting portions of the plurality of rigid supporting portions. Since the main structure of the foldable substrate is a plurality of rigid supporting portions, the foldable substrate may not become deformed during the manufacturing process. In addition, two adjacent rigid supporting portions are connected via a flexible foldable portion, and then the foldable substrate may be bent and folded at the flexible foldable portion, so that the foldable substrate may be both rigid and foldable.

Figure 1:
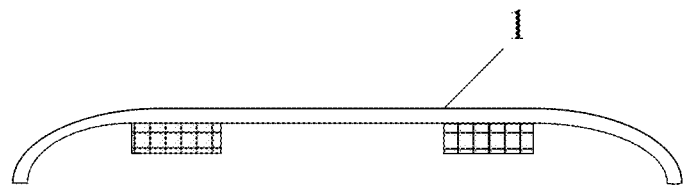
FIG. 1 is a sectional view of a flexible display device provided with a plastic base substrate in the related art.

DRAWING REFERENCES 1 plastic substrate
2 carrier substrate
3 glass substrate
4 organic material
5 display component
A rigid supporting portion
B rigid supporting portion
C flexible foldable portion
A1 groove
A2 organic base substrate
B1 groove
B2 organic base substrate

DETAILED DESCRIPTION

In order to make the technical issues, the technical solutions and the advantages of the present disclosure more apparent, the present disclosure will be described hereinafter in detail in conjunction with the drawings and embodiments.

In the related art, a thin glass substrate of a flexible display device is not foldable and a plastic substrate is of a poor stability and mechanical strength. In view of this, a foldable substrate, a method for forming the same and a flexible display device are provided in the embodiments of the present disclosure, where the foldable substrate is both rigid and foldable, and a flexible display device supported by the foldable substrate is foldable.

A foldable substrate is provided in some embodiments of the present disclosure, including:
  a plurality of rigid supporting portions separated from each other, every two of which are not in contact with each other;
  a flexible foldable portion connecting two adjacent rigid supporting portions of the plurality of rigid supporting portions.

The foldable substrate in the embodiments of the present disclosure includes a plurality of rigid supporting portion and a flexible foldable portion connecting two adjacent rigid supporting portions of the plurality of rigid supporting portions. Since the main structure of the foldable substrate is a plurality of rigid supporting portions, the foldable substrate may not become deformed during the manufacturing process. In addition, two adjacent rigid supporting portions are connected via a flexible foldable portion, and then the foldable substrate may be bent and folded at the flexible foldable portion, so that the foldable substrate may be both rigid and foldable.

The flexible foldable portion is made of a flexible material. Specifically, the flexible foldable portion may be made of an organic material.

In some embodiments of the present disclosure, the organic material includes polyethylene naphthalene, polyethylene terephthalate, polyimide and cyclic polyolefin.

In order to combine the rigid supporting portions tightly to the flexible foldable portion, the rigid supporting portions each includes:
  an organic base substrate provided with a groove;
  a hard substrate arranged in and adapted to the groove, where the hard substrate fits tightly to the groove.

Specifically, the hard substrate may be a glass substrate. Obviously, the hard substrate is not limited to a glass substrate, any substrate as long as possessing both transparency and rigidity is available, such as a quartz substrate.

In the case that the rigid supporting portion includes an organic base substrate and a hard substrate, the organic base substrate may be formed integrally with the flexible foldable portion made of an organic material, so that the rigid supporting portions and the flexible foldable portion may be tightly combined.

Optionally, the plurality of rigid supporting portions is of an identical size and an identical shape.

Figure 10:
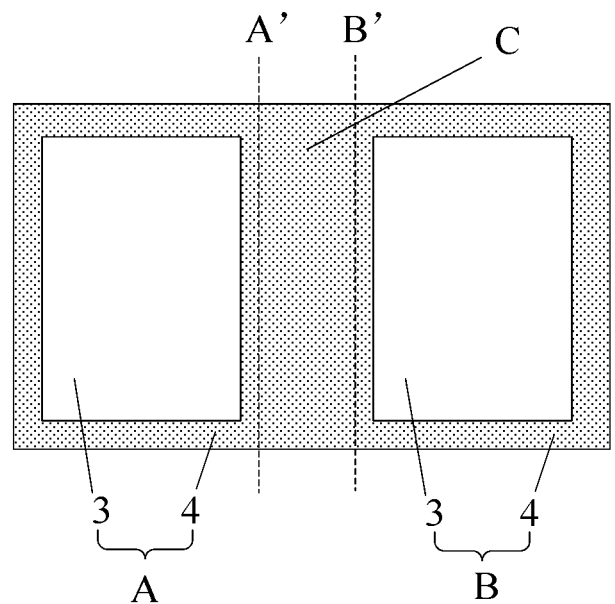
FIG. 10 is a plan view of a foldable substrate in some embodiments of the present disclosure.

In some embodiments of the present disclosure, as shown in FIG. 10, the foldable substrate may include:
  two rigid supporting portions A, B (arranged in the left side of the dotted line A' and the right side of the dotted line B' respectively in FIG. 10) and a flexible foldable portion C (arranged between the dotted line A' and the dotted line B' in FIG. 10) connecting the two rigid supporting portions, where the rigid supporting portions may be of a cuboid shape. The rigid supporting portions A, B each includes a glass substrate 3 and an organic material 4, and the flexible foldable portion C is made of the organic material 4.

Figure 11:
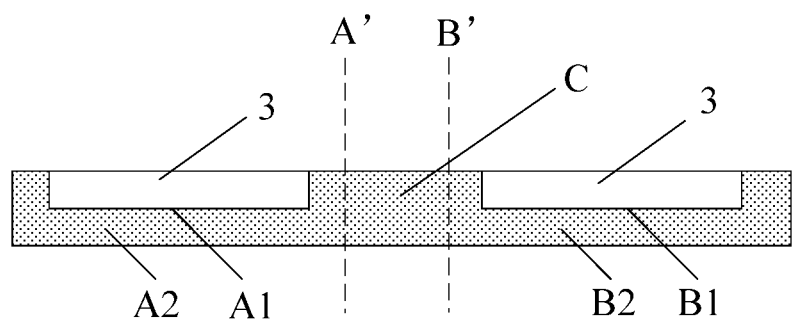
FIG. 11 is a sectional view of a foldable substrate in some embodiments of the present disclosure.

In some embodiments of the present disclosure, as shown in FIG. 11, the rigid supporting portion A includes an organic base substrate A2 provided with a groove A1, and a glass substrate 3 arranged in and adapted to the groove A1, and the glass substrate 3 fits tightly to the groove A1. The rigid supporting portion B includes an organic base substrate B2 provided with a groove B1, a glass substrate 3 arranged in and adapted to the groove B1, and the glass substrate 3 fits tightly to the groove B1.

A flexible display device is further provided in some embodiments of the present disclosure, including the above-mentioned foldable substrate and a display component arranged on the foldable substrate. The display device may be any product or component having a display function, such as a monitor, a digital photo frame, a mobile phone, a tablet PC etc.

A method for forming a foldable substrate is further provided in some embodiments of the present disclosure, including:
  arranging a plurality of hard substrates separated from each other, every two of which are not in contact with each other, on a carrier substrate;
  coating a flexible material onto the carrier substrate arranged with the plurality of hard substrates, to fill gaps between two adjacent hard substrates of the plurality of hard substrates and cover all the plurality of hard substrates; and separating the plurality of hard substrates and the flexible material from the carrier substrate, to form a foldable substrate, where the rigid supporting portions of the foldable substrate include the plurality of hard substrates and the flexible material covering the plurality of hard substrates, and the flexible foldable portion of the foldable substrate includes the flexible material between the plurality of hard substrates.

According to the foldable substrate formed by the method in the embodiment of the present disclosure, the foldable substrate includes a plurality of rigid supporting portion and a flexible foldable portion connecting two adjacent rigid supporting portions of the plurality of rigid supporting portions. Since the main structure of the foldable substrate is a plurality of rigid supporting portions, the foldable substrate may not become deformed during the manufacturing process. In addition, two adjacent rigid supporting portions are connected via a flexible foldable portion, and then the foldable substrate may be bent and folded at the flexible foldable portion, so that the foldable substrate may be both rigid and foldable.

A flexible foldable portion is made of a flexible material. Specifically, the flexible foldable portion may be made of an organic material. The hard substrate may be a glass substrate. Obviously, the hard substrate is not limited to a glass substrate, any substrate as long as possessing both transparency and rigidity is available, such as a quartz substrate.

Figure 2:
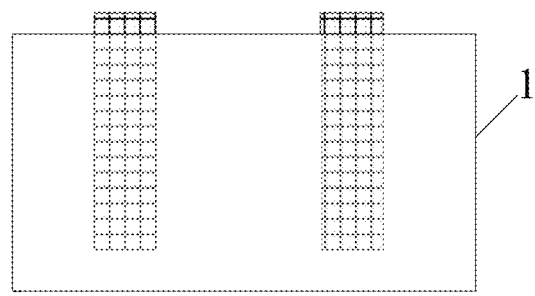
FIG. 2 is a plan view of a flexible display device provided with a plastic base substrate in the related art.

Currently, a substrate of a flexible display device which is bendable is generally required to be thin and light, so it lacks of rigidity in general. As shown in FIG. 1 and FIG. 2, when the substrate is a plastic substrate, because of a poor rigidity of the plastic substrate 1, during the manufacturing of flexible display device, the plastic substrate 1 will be bent, and the yield of product may be reduced as a result. As a solution in the related art, a glass substrate is used as a carrier of the plastic substrate during the manufacturing process, and the glass substrate is separated from the plastic substrate after the manufacturing process is completed, therefore the manufacturing process may be more complex and the cost of production may be increased.

Figure 3:
FIG. 3 is a schematic view showing a carrier substrate and glass substrates arranged thereon in some embodiments of the present disclosure.
Figure 4:
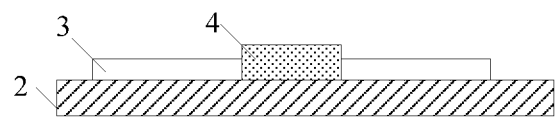
FIG. 4 is a schematic view showing a carrier substrate, glass substrates arranged thereon and an organic material coated in a gap between the glass substrates in some embodiments of the present disclosure.
Figure 5:
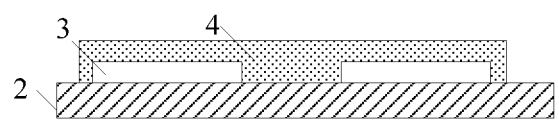
FIG. 5 is a schematic view showing a carrier substrate, glass substrates arranged thereon and an organic material coated onto the glass substrates in some embodiments of the present disclosure.
Figure 6:
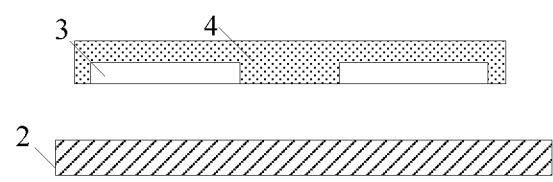
FIG. 6 is a schematic view showing the glass substrate and the carrier substrate which are separated from each other in some embodiments of the present disclosure.
Figure 7:
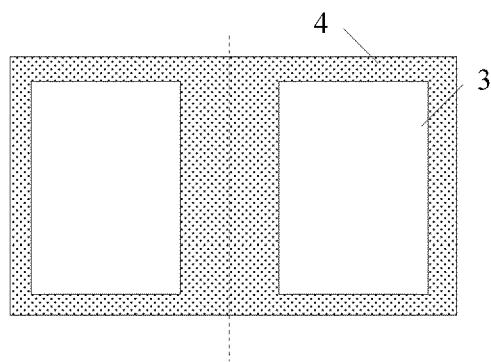
FIG. 7 is a plan view of a foldable substrate in some embodiments of the present disclosure.

In order to solve the above issues, a foldable substrate is provided in some embodiments of the present disclosure. The foldable substrate is made of a glass material and an organic material, the main structure thereof is made of glass, and a predetermined bending portion is made of an organic material. Specifically, a method for forming a foldable substrate in some embodiments of the present disclosure includes:

Step a: as shown in FIG. 3, arranging two or a plurality of glass substrates 3 on a carrier substrate 2, where the plurality of glass substrates 3 are separated from each other. Specifically, arranging two glass substrates 3 on the carrier substrate 2 is taken as an example to illustrate the embodiment;

Step b: as shown in FIG. 4, coating an organic material 4 onto the carrier substrate 2 arranged with the glass substrates 3, to fill gaps between two adjacent glass substrates 3;

Step c: as shown in FIG. 5, coating the organic material 4 onto the carrier substrate 2, so as to cover surfaces of every glass substrates 3 by the organic material 4;

Step d: as shown in FIG. 6, separating the glass substrates 3 and the organic material 4 from the carrier substrate 2, specifically, irradiating a boundary between the glass substrates 3 and the organic material 4 and the carrier substrate 2 with a laser beam, to separate the glass substrates 3 and the organic material 4 from the carrier substrate 2, to form a foldable substrate as shown in FIG. 7, where the rigid supporting portions of the foldable substrate include the glass substrates 3 and the organic material 4 covering the glass substrates 3, and the flexible foldable portion includes the organic material 4 between the adjacent glass substrates 3. Since the main structure of the foldable substrate is the glass substrates 3, the foldable substrate may not become deformed during the manufacturing process. In addition, the material of the flexible foldable portion is an organic material, therefore it is able to bend and fold the foldable substrate.

Figure 8:
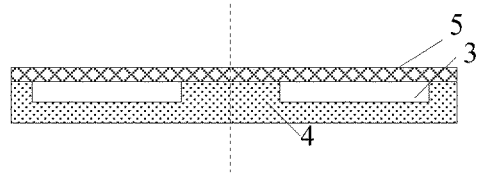
FIG. 8 is a sectional view of a flexible display device in some embodiments of the present disclosure.
Figure 9:
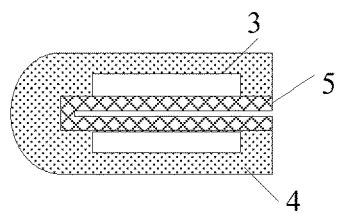
FIG. 9 is a schematic view of a bended flexible display device in some embodiments of the present disclosure.

As shown in FIG. 8, after the above steps, by using the foldable substrate as a base substrate, a thin film transistor, a pixel defining layer, an anode, an organic light emitting layer and a cathode are formed on the foldable substrate, to form a flexible display device including the display component 5. As shown in FIG. 9, the flexible display device may be folded at a predetermined bendable portion.

The foldable substrate in the embodiments of the present disclosure is made of glass and organic material. Since the main structure of the foldable substrate is the glass substrates, the foldable substrate may not become deformed during the manufacturing process. In addition, adjacent glass substrates are connected via the organic material, and then the foldable substrate may be bent and folded at the boundaries of adjacent glass substrates, so that the foldable substrate may be both rigid and foldable.

The above are merely some embodiments of the present disclosure. It should be appreciated that, a person skilled in the art may make further modifications and improvements without departing from the principle of the present disclosure, and these modifications and improvements should also fall within the scope of the present disclosure.

What is claimed is:

1. A foldable substrate, comprising:
a plurality of rigid supporting portions separated from each other, every two of which are not in contact with each other; and
a flexible foldable portion connecting two adjacent rigid supporting portions of the plurality of rigid supporting portions;
the flexible foldable portion is made of an organic material;
the plurality of rigid supporting portions each comprises:
an organic base substrate provided with a groove; and
a hard substrate arranged in and adapted to the groove, wherein the hard substrate fits tightly to the groove.

2. The foldable substrate according to claim 1, wherein the organic material comprises polyethylene naphthalene, polyethylene terephthalate, polyimide and cyclic polyolefin.

3. The foldable substrate according to claim 2, wherein the plurality of rigid supporting portions separated from each other, every two of which are not in contact with each other, comprises two rigid supporting portions, and the foldable substrate further comprises the flexible foldable portion connecting two rigid supporting portions.

4. The foldable substrate according to claim 1, wherein the hard substrate is a glass substrate.

5. The foldable substrate according to claim 4, wherein the plurality of rigid supporting portions separated from each other, every two of which are not in contact with each other, comprises two rigid supporting portions, and the foldable substrate further comprises the flexible foldable portion connecting two rigid supporting portions.

6. The foldable substrate according to claim 1, wherein the organic base substrate is formed integrally with the flexible foldable portion.

7. The foldable substrate according to claim 6, wherein the plurality of rigid supporting portions separated from each other, every two of which are not in contact with each other, comprises two rigid supporting portions, and the foldable substrate further comprises the flexible foldable portion connecting two rigid supporting portions.

8. The foldable substrate according to claim 1, wherein the plurality of rigid supporting portions separated from each other, every two of which are not in contact with each other, comprises two rigid supporting portions, and the foldable substrate further comprises the flexible foldable portion connecting two rigid supporting portions.

9. The foldable substrate according to claim 8, wherein two rigid supporting portions are of a cuboid shape.

10. A flexible display device comprising the foldable substrate according to claim 1 and a display component arranged on the foldable substrate.

11. The foldable substrate according to claim 1, wherein the plurality of rigid supporting portions separated from each other, every two of which are not in contact with each other, is of an identical size and an identical shape.

12. The foldable substrate according to claim 1, wherein the organic base substrate is made of a material identical to the flexible foldable portion.

\* \* \* \* \*